United States Patent
Yamabayashi et al.

(10) Patent No.: US 6,575,641 B2
(45) Date of Patent: Jun. 10, 2003

(54) LASER DIODE MODULE

(75) Inventors: Naoyuki Yamabayashi, Osaka (JP); Yoshiki Kuhara, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 32 days.

(21) Appl. No.: 09/970,782

(22) Filed: Oct. 5, 2001

(65) Prior Publication Data

US 2002/0057876 A1 May 16, 2002

(30) Foreign Application Priority Data

Nov. 13, 2000 (JP) .................................... 2000/344843

(51) Int. Cl.$^7$ ................................................ G02B 6/36
(52) U.S. Cl. ........................ 385/88; 385/14; 385/49; 372/32; 257/98
(58) Field of Search ............................ 385/88, 14, 49; 372/32; 257/98; 359/163

(56) References Cited

U.S. PATENT DOCUMENTS 5,675,684 A * 10/1997 Hirataka ..................... 385/88
5,854,867 A * 12/1998 Lee ............................ 385/49
5,881,193 A *  3/1999 Anigbo ....................... 385/93
6,141,471 A * 10/2000 Agatsuma .................... 385/49

FOREIGN PATENT DOCUMENTS

DE          43 13 492 C1      7/1994

OTHER PUBLICATIONS

Y. Akahori et al. "A Hybrid High–Speed Silica–Based Planar Lightwave Circuit Platform Integrating A Laser Diode And A Driver IC" *11$^{th}$International Conference on Integrated Optics and Optical Fibre Communications*, vol. 2, Conference Publication No. 448, ECOC 97, Sep. 22–25, 1997, pp. 359–362.

* cited by examiner

Primary Examiner—John Juba, Jr.
Assistant Examiner—Leo Boutsikaris
(74) Attorney, Agent, or Firm—Smith, Gambrell & Russell, LLP

(57) ABSTRACT

An LD module comprising a substrate, an LD, an LD driving IC and a monitoring PD mounted in this order on the substrate, wirings for connecting the LD to the IC, and a light guiding device provided below the IC for guiding the LD light to the monitoring PD by detouring the LD light beneath the LD driving IC.

32 Claims, 16 Drawing Sheets

EMBODIMENT 1

EMBODIMENT 1

EMBODIMENT 1

Improvement of EMBODIMENT 1

EMBODIMENT 2

EMBODIMENT 2

EMBODIMENT 3

EMBODIMENT 3

EMBODIMENT 4

EMBODIMENT 4

EMBODIMENT 6

EMBODIMENT 6

EMBODIMENT 7

EMBODIMENT 7

EMBODIMENT 8

EMBODIMENT 8

Fig.18 EMBODIMENT 9
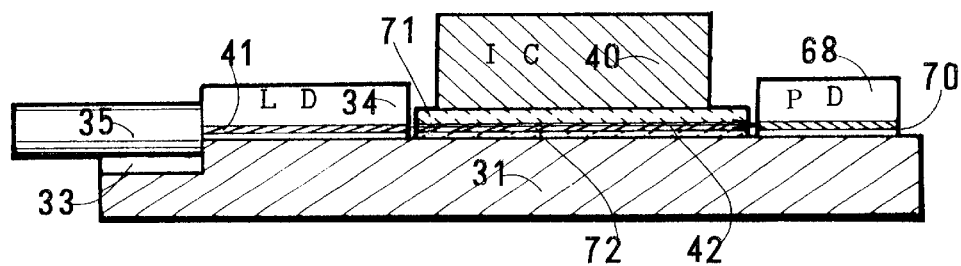
Fig.19 EMBODIMENT 9
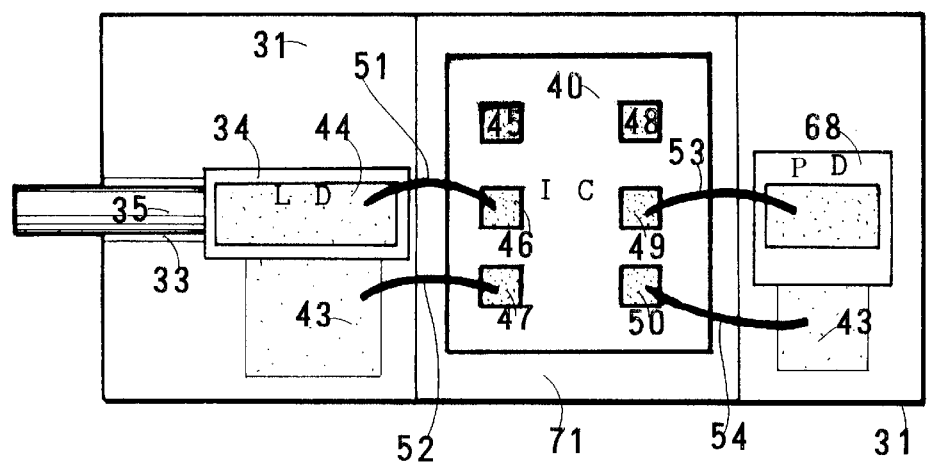

EMBODIMENT 10

EMBODIMENT 10

EMBODIMENT 11

EMBODIMENT 11

EMBODIMENT 13

EMBODIMENT 14

LASER DIODE MODULE

BACKGROUND OF THE INVENTION

1. Field of the Invention

This invention relates to a laser diode (LD) module of optical communications system relying upon optical fibers.

This application claims the priority of Japanese Patent Application No. 344843/2000 filed on Nov. 13, 2000 which is incorporated herein by reference.

2. Description of Related Art

FIG. 26 shows an axially-symmetric metal-canned laser diode (LD) module which is one of the most prevalent laser diode modules at present. The predominant LD module has a circular metallic stem 80 having an erect pole 84 on the top, lead pines 90 projecting from the bottom of the stem, an LD chip 85 mounted in a vertical posture on the front wall of the pole 84, a monitoring photodiode (PD) 86 bonded on the stem beneath the LD 85, a cylindrical metallic cap 83 covering the LD 85 and the PD 86, a cylindrical metallic lens holder 81 having a lens 87 and being fitted upon the stem 80 and a conical metallic ferrule holder 82 with a ferrule 89 holding an optical fiber 88 and being soldered on the lens holder 81. The monitoring photodiode 86 is a "top incidence" type PD which allows light to enter via a top opening around a ring p-electrode.

In the prior art metal-canned LD module, the lens 87, the LD 85 and the monitoring PD 86 align along an extension of the optical fiber 88. The metallic lens holder 81, the metallic stem 80 and the metallic ferrule holder 82 are all rotationally-symmetric around the axial line of the optical fiber 88. An IC 91 for driving the LD 85 is fitted upon a print circuit board 92 comprising an epoxy board, copper wiring patterns 93 printed on the epoxy board and many bores. The lead pins 90 are inserted in holes and soldered to wiring patterns of the print circuit board. The IC connected wiring patterns are joined to the electrodes of the LD driving IC 91. The LD driving IC 91 supplies pulse signal currents to the LD 85.

The metallic stem 80, the metallic lens holder 81 and the metallic ferrule holder 82 build a metallic package. The path of the light is in parallel to the axial line of the metal package. The monitoring PD 86, the LD 85, the lens 87 and the fiber 88 align along the axial line of the package. The metallic package repulses electromagnetic noise. The metal case has also high resistance against water and oxygen. Thus, the metal encapsulated LD module is an excellent device endowed with high reliability and long life time.

The vertically sustained LD 85 emits light in both upward and downward directions. The upward light from the LD 85 transmits signal light which is introduced by the lens 87 into the fiber 88. The downward light from the LD 85 is power-monitoring light which is sensed by the monitoring PD 86. The LD power is sent from the monitoring PD 86 to the LD driving IC 91. The LD driving IC 91 controls the LD via a feedback circuit for maintaining a constant output power in spite of a change of the surrounding temperature or degradation due to aging. The LD driving IC 91 has a function of adjusting the LD power in addition to the role of making signal pulse currents.

The metallic package has a three dimensional structure having the lead pins protruding from the bottom and the fiber at the top. The light progresses in the direction orthogonal to the stem. The signal light from the LD propagates in the space, the lens and the space in series to the fiber. The space propagation disperses the light. The lens is indispensable for converging the dispersed light. The discrete parts should be allocated to the optimum positions which allow the LD to inject the maximum power into the fiber. The optimum positions are determined by measuring the output power at another end of the fiber with displacing the lens holder, the ferrule holder in the x-, y- and z-directions with respect to the stem. The process of allotting the parts to the most suitable spots is called "alignment".

The print circuit board 92 sustains the LD driving IC 91. The LD 85 is stored in the metallic case. The LD 85 and the LD driving IC 91 are separated. Drawbacks accompany the prevalent LD module containing the metal cased LD module and the circuit board loaded LD driving IC. The current LD module is bulky, since it contains the print circuit board for maintaining the LD driving IC. The module requires many discrete elements, which raises the parts cost and the assembling cost. The existence of the discrete elements impedes miniaturization of the modules. High cost and big size of the modules inhibit the optical communications networks from prevailing on a large scale. Further development of the optical communications requires miniaturization and cost reduction of the necessary devices.

Planar lightguide circuit (PLC) type optoelectronic modules have been proposed for the sake of propelling miniaturization. Various types of PLC modules have been suggested till now. The proposed PLCs are all still suffering from some difficulties. There are no PLC devices satisfying all the basic requests yet.

① German Patent DE 43 13 492 C1, "Anordnung zur Ankopplung eines optoelektronischen Empfangselementes an ein optoelektronisches Sendeelement", proposed an LD module which employs a bottom incidence type PD as a monitoring photodiode (PD). The newly proposed PLC LD module has a silicon substrate with a front V-groove and a rear V-groove dug along the central line of the substrate, an LD chip mounted upon a plateau between the front and the rear V-grooves, a cylindrical lens mounted on the substrate before the front V-groove, an optical fiber directly joined to the lens and a monitoring PD over the rear V-groove on the substrate. On the silicon substrate, the fiber, the cylindrical lens, the front V-groove, the LD, the rear V-groove and the monitoring PD align in series from the front to the back. The LD chip emits signal light in both directions from the front end and the back end. The front light is converged by the lens and is introduced into the fiber. The rear light emanating from the LD is power-monitoring light which is reflected by banks or an end mirror plane of the rear V-groove and is guided into the PD via the bottom. The bottom incidence type PD requires a change of light path. The rear V-groove having the banks and the end mirror respond the request. The beam line of the LD is parallel to the central line of the silicon substrate. Unlike the previous LD module as shown in FIG. 26, the PLC type module has two dimensional character, which simplifies the structure of the package. The most significant advantage is to eliminate the time-consuming positive alignment. The position of the fiber is definitely positioned by the V-groove and the positions of the LD and PD are exactly determined by marks attached on the substrate. The simplified structure is favorable for miniaturization. The rear V-groove enables the bottom incidence PD to catch nearly half of the rear light emanating from the LD in the rear direction. The prior art had no LD driving IC on the substrate. Like the previous art of FIG. 26, the LD driving IC would be mounted upon another print circuit board and would be joined to the LD by wiring patterns and bonding wires.

② Y Akahori, T. Ohyama, M. Yanagisawa, Y Yamada, H. Tsunetsugu, Y Akatsu, M. Togashi, S. Mino and Y. Shibata, "A HYBRID HIGH-SPEED SILICA-BASED PLANAR LIGHTWAVE CIRCUIT PLATFORM INTEGRATING A LASER DIODE AND A DRIVER IC", ECOC 97, Sep. 22–25, 1997, Conference Publication No. 448, IEE, 1997, p 359–362 proposed an improvement of loading LDs and a driving IC on a silicon bench. FIG. 1 of ② is shown as FIG. 27 here. An LD 96 is one of an LD array which includes a plurality of LD chips. The LD array is driven by a single driving IC 97. The transmitting distance is very short of several meters to several tens of meters. The signal repetition rate is 9 Gbps. The LD driving IC 97 is positioned just behind the LD 96 for ensuring the high signal transmission rate of 9 Gbps.

Since the LD driving IC occupies the rear terrace at the back of the LD, the module can allocate no monitoring PDs on the substrate. The omission of the monitoring PDs causes instability of the LD for a change of temperature or incompetence for treating with the degeneracy by aging. The LD array module should be used in tightly air-conditioned circumstances maintaining a constant surrounding temperature. This is only a single prior art having the driving IC on the same substrate as the LD.

High speed transmission forces the LD driving IC to be close to the LD. However, the monitoring PD is also important for regulating the output power of the LD.

The inventors of the present invention found no prior art module having the monitoring PD and the driving IC on the same substrate as the LD. The driving IC is as important for the LD as the monitoring PD.

Significant requests for LD/PD modules are miniaturization, low-cost and high signal frequency. The present invention pays attention in particular, to an LD module for heightening the transmission signal frequency. The current signal repetition rates are 156 Mbps or 622 Mbps. But near future requires 1.25 Gbps or 2.5 Gbps for a signal repetition rate. Perhaps far higher repetition rates of 5 Gbps and 10 Gbps will be required in not so far future.

The high speed signal rate causes new problems on both transmitting devices (LD modules) and receiving devices (PD modules). In the LD module, the LD and the IC are connected by thin wires and metallized patterns printed on the substrate. The LD driving current is large and the LD input impedance is low. The current signal repetition rates of 156 Mbps and 622 Mbps cause no problem owing to the large LD current and the low LD impedance. Signal repetition rates higher than 1 Gbps will incur a problem of signal distortion owing to the inductance of the wiring (wires and patterns) connecting the LD and the LD driving IC. The self-inductance of the LD/IC wiring is denoted by "L". "L" is in proportion to the length of the medium. The wiring has a complex impedance of "$j\omega L$", where $\omega$ is an angular frequency ($\omega=2\pi f$) and j is a unit of a imaginary number. The impedance is in proportion to f.

When the signal speed is low, the impedance is negligible. However, the wiring impedance $j\omega L$ is innegligible for high repetition rate signals, because $j\omega L$ increases in proportion to the signal frequency f. The large wiring impedance induces a decrease of the pulse voltage applied upon the LD, incurs a signal delay of the LD and causes distortion of the LD signal pulses. The distortion and the delay prohibit the LD from generating regular pulses at a high repetition rate.

The prevalent prior art of FIG. 26 connects the LD 85 in the metallic case (80, 81, 82) via the pole 84, the wire, the stem 80, the leadpins 90 and patterns 93 to the LD driving IC 91 bonded upon another print circuit board 92. The inductance L increases in proportion to the length. The LD/IC wiring including the pole, the wire, the stem, the leadpins and the print patterns has a large self inductance "L". For example, a 1 mm long wire (30 $\mu m\phi$) has 1 nH (nanohenry=$10^{-9}$ henry) of self inductance. The prior art of FIG. 26 is incompetent for high repetition rate communications of 2.5 Gbps or 5 Gbps due to the large impedance of the wiring between the LD and the IC.

The prior art of FIG. 27 proposes access of the IC 97 to the LD 96. The LD is interposed between the waveguide and the IC. There is no room for a PD. Geometrical conditions prohibit the FIG. 27 device from attaching a monitoring PD. The spatial restriction forces the FIG. 27 module to eliminate a PD for monitoring the LD power. FIG. 27 lacks a monitoring PD. The IC is not aware of degeneration or aging of the LD. Exclusion of the monitoring PD forces the module to give up the controllability of the LD. Loss of the LD controllability invites instability and malfunction. The module forfeits reliability by high probability of malfunction.

SUMMARY OF THE INVENTION

The inventors of the present invention considered over the arrangement of the LD, the LD driving IC and the monitoring PD. The PD succeeds the LD in prior modules. The PD is positioned at a spot close to the LD for receiving the LD light as much as possible. The skilled believe in the access of the PD to the LD as a matter of course. Long consideration taught the inventors that the monitoring PD was not necessarily close to the LD but could be distanced from the LD, so long as the PD could catch the light emitted from the rear of the LD. The inventors were aware that geometric access was not a requisite condition for the reception of the LD light. The inventors found the fact that the access of the driving IC to the LD was more important than the access of the monitoring PD to the LD. The inventors tried to mount both the IC and the PD near the LD and succeeded in giving both the PD and the IC access to the LD.

One purpose of the present invention is to provide an LD module succeeding in the access of the IC to the LD without omission of the monitoring PD. Another purpose of the present invention is to provide an LD module with a far smaller inductance of wiring between the LD and the IC than prior ones. A further purpose is to provide to an LD module suitable for high repetition rate transmission. A further purpose of the present invention is to provide an LD module ensuring controllability of the LD power even for high repetition rate transmission. Another purpose of the present invention is to provide an LD module maintaining reliability for high repetition rate transmission.

The present invention positions the IC next to the LD and the PD following the IC and detours the LD rear light below the IC to the PD. Namely this invention aligns the LD, the IC and the PD in this order. The LD rear beams detour below the IC and attains to the PD. An outputting medium (optical fiber or waveguide) precedes the LD for sending the LD forward light to other nodes (or stations) in an actual module. The outputting medium, the LD, the IC, the detouring device and the PD are preferably covered with a transparent resin.

There is no prior art which leads the LD light to the PD by detouring the LD light around the IC. Nobody has suggested such a detour of light around an obstacle. Without an idea of detouring, the PD could not be mounted on the module. The detouring enables the LD module having the driving IC to carry a monitoring PD.

The novel LD/IC/PD structure of the present invention brings about the access of the IC to the LD. The IC/LD access shortens the wiring path between the LD and the IC. Shortening of the wiring decreases the inductance "L" and impedance "jωL". Reduction of jωL of the LD/IC wiring suppresses the signal delay and the signal distortion.

The access of the IC to the LD separates the PD from the LD. The IC is an obstacle for the coupling of the PD and the LD. The LD rear beams are detoured for avoiding the IC and are guided to the PD positioned at the backmost in the series of the LD/IC/PD.

The advantages of the present invention are described. The present invention proposes a novel LD module having a series of an LD, an IC and a PD on a substrate. The IC/LD access shortens the wires, and the patterns, which reduces signal distortion and signal delay.

The LD device has an advantage which is suitable for high speed transmission of 5 Gbps to 10 Gbps in addition to the low-cost and the miniaturization.

BRIEF DESCRIPTION OF THE DRAWINGS

FIG. 18 is a sectional view of an LD module as Embodiment 9 including a silicon bench having a front open V-groove, an LD epi-down mounted upon a plateau following the front V-groove, a submount with a waveguide being mounted on the substrate following the LD, an LD driving IC bonded upon the waveguide-carrying submount and a front end incidence type monitoring PD following the IC and being mounted on the substrate for receiving rear LD light passing through the waveguide in the submount below the IC.

FIG. 19 is a plan view of an LD module as Embodiment 9 including a silicon bench having a front open V-groove, an LD epi-down mounted upon a plateau following the front V-groove, a submount with a waveguide being mounted on the substrate following the LD, an LD driving IC bonded upon the waveguide-carrying submount and a front end incidence type monitoring PD following the IC and being mounted on the substrate.

DETAILED DESCRIPTION OF THE PREFERRED EMBODIMENTS

The present invention arranges an LD, a driving IC and a monitoring PD in series on a substrate and detours LD light beneath the IC to the PD. The light guide device for detouring LD light is laid at the same position as the IC. There are various types of the light guiding (detouring) device for leading the LD light to the PD by avoiding the IC. Available PDs and LDs are listed here.

Figure 1:
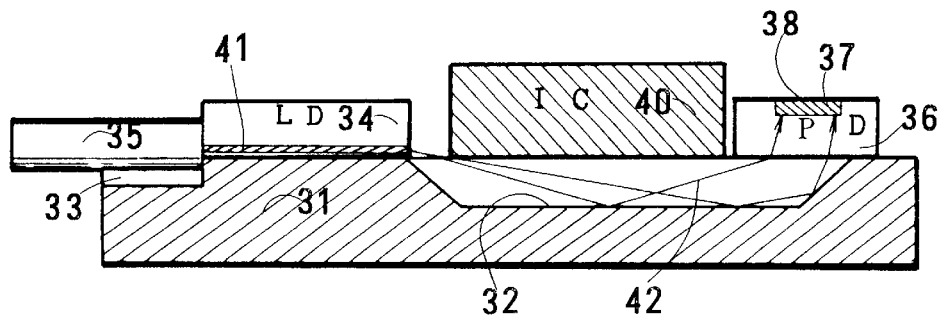
FIG. 1 is a sectional view of an LD module as Embodiment 1 including a silicon bench having a front open V-groove and an intermediate lightguiding groove, an LD epi-down mounted upon a plateau between the front V-groove and the medium lightguiding groove, an LD driving IC mounted on the substrate over the lightguiding groove and a bottom incidence type monitoring PD mounted over an end of the lightguiding groove for receiving rear LD light reflected and detoured by the lightguiding groove.
Figure 2:
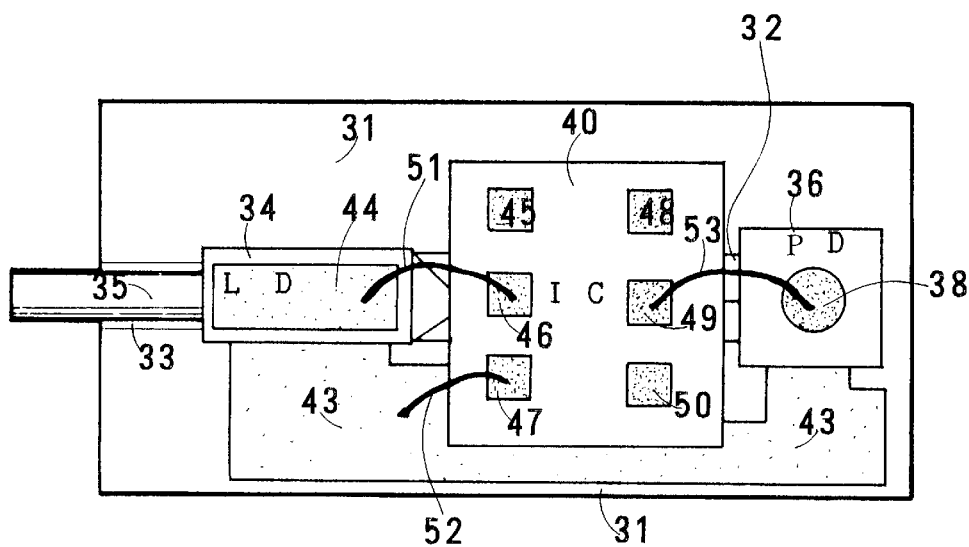
FIG. 2 is a plan view of an LD module as Embodiment 1 including a silicon bench having a front open V-groove and an intermediate lightguiding groove, an LD epi-down mounted upon a plateau between the front V-groove and the medium lightguiding groove, an LD driving IC mounted on the substrate over the lightguiding groove and a bottom incidence type monitoring PD mounted over an end of the lightguiding groove.

(a) Light guiding device
  1. lightguiding groove,
  2. submount with tunnel-cavity,
  3. transparent submount,
  4. transparent submount with waveguide,
  5. IC with a bottom cavity
  6. optical fiber
(b) Monitoring PD (type of incidence)
  1. bottom incidence type PD
  2. front end incidence type PD
(c) Monitoring PD (type of material)
  1. InP-PD (InP-substrate, InGaAs or InGaAsP light receiving layer)
  2. GaAs-PD (GaAs-substrate, GaAs light receiving layer)
  3. Ge-PD (Ge-substrate, Ge light receiving layer)
  4. Si-PD (Si-substrate, Si light receiving layer)
(d) LD (type of material)
  1. InP-LD (InP-substrate, InGaAs or InGaAsP light emission layer)
  2. GaAs-LD (GaAs-substrate, AlGaAs light emission layer)
(e) driving IC (type of material)
  1. Si-IC
  2. GaAs-IC
  3. InP-IC
(f) outputting medium
  1. optical fiber
  2. waveguide
(g) substrate
  1. silicon substrate
  2. ceramic substrate
  3. plastic substrate Embodiment 1
(Bottom Incidence type PD; Lightguiding Groove; FIGS. 1, 2)

FIG. 1 and FIG. 2 show Embodiment 1 having a silicon substrate 31 on which a front V-groove 33 and a middle lightguiding groove 32 are formed. The V-groove 33 has an open front end. The lightguiding groove 32 has both closed ends. The silicon substrate 31 supports a fiber 35, a laser diode (LD) 34, an LD driving IC 40 and a bottom incidence type monitoring photodiode (PD) 36 in series. The fiber 35 is fitted in the front V-groove 33. The LD 34 is mounted upside down (epi-down) on a plateau between the V-groove 33 and the lightguiding groove 32. Following the LD 34, the LD driving IC 40 is mounted over the lightguiding groove 32 on the silicon substrate 31. The feature of the present invention is the LD driving IC directly following the LD. Access of the LD 34 and the IC 40 allows the module to raise the signal frequency higher than prior ones which far separate the LD and the driving IC. The lightguide groove 32 has a length longer than the length of the IC 40 but a narrower width than the IC 40. Thus, the IC 40 bridges the lightguiding groove 32 in the lateral direction. The back end of the groove 32 extends longer than the end of the IC 40. The end of the lightguiding groove 32 is assigned to a mirror plane. The bottom incidence type PD 36 is epi-up fitted over the end of the lightguiding groove 32 on the silicon substrate 31. The monitoring PD 36 has a sensing layer 37 at an upper middle part and a p-electrode 38 on the top. The order of the elements (LD, IC and PD) is common with all the embodiments.

The substrate 31 has a series of devices LD34+IC40+PD36 aligning along the center line. The LD+IC+PD arrangement which is entirely novel is a fundamental feature of the present invention. FIG. 2 is a plan view showing printed metallized patterns, electrodes and wires for connecting the patterns and the electrodes. The silicon substrate 31 has a metallized wiring patten 43 extending from the front to the back for joining a lower pad (anode; p-electrode) of the LD 34 to a lower pad (cathode; n-electrode) of the monitoring PD 36. The p-electrode of the LD 34 is soldered on the front region of the pattern 43. The n-electrode of the PD 36 is soldered on the rear end of the pattern 43.

The LD 34 has an upper electrode (n-electrode; cathode) 44. The monitoring PD 36 has an upper pad (p-electrode; anode) 38. There are pads 45, 46, 47, 48, 49 and 50 on the top of the LD driving IC 40. The pad 49 on the IC 40 is connected to the upper pad (p-electrode) 38 of the PD 36 by a wire 53. The pad 46 is joined to the upper electrode (n-electrode) 44 of the LD 34 by a wire 51. The pad 47 of the IC 40 is connected to the wiring pattern 43 on the substrate 31 by a wire 52. The wiring pattern 43 is joined to the source voltage (e.g., Vcc). The anode of the LD 34, the Vcc pad 47 of the IC 40 and the cathode of the PD are connected to the source voltage Vcc. The driving pulse current is supplied from the output pad 46 via the short wire 51 to the LD cathode 44 of the LD34. The LD is driven by the pulsation current from the IC 40. An emission region 41 emits forward light from the front end and rear light from the rear end in the axial direction. The forward light which is a signal light goes into the fiber 35 and propagates in long fibers to a central station (not shown). The rear light emanating from the LD 34 is shot on the slanting walls of the lightguiding groove 32. The rear light is reflected by the banks and is introduced via the bottom into the monitoring PD 36, as shown in FIG. 1. Turning a bit at the interface due to the differences of the refractive indices, the rear light attains to the sensing layer 37 and makes photocurrent in proportion to the output of the LD 34. The lightguiding groove 32 is a detour for the rear LD light from the LD 34 to the PD 36. The novel point of the invention is the access of the driving IC to the LD and the detour groove for avoiding the obstacle IC for guiding the monitoring light to the PD 36. Without the lightguiding groove, the monitoring light could not attain to the PD. Although the PD 36 is entirely hidden behind the obstacle IC 40 from the LD 34, the detour prepared by the lightguiding groove enables the rear light to reach the backmost PD 36. The gist of the present invention is to detour the rear LD light by the lightguiding groove to the monitoring PD 36.

Figure 26:
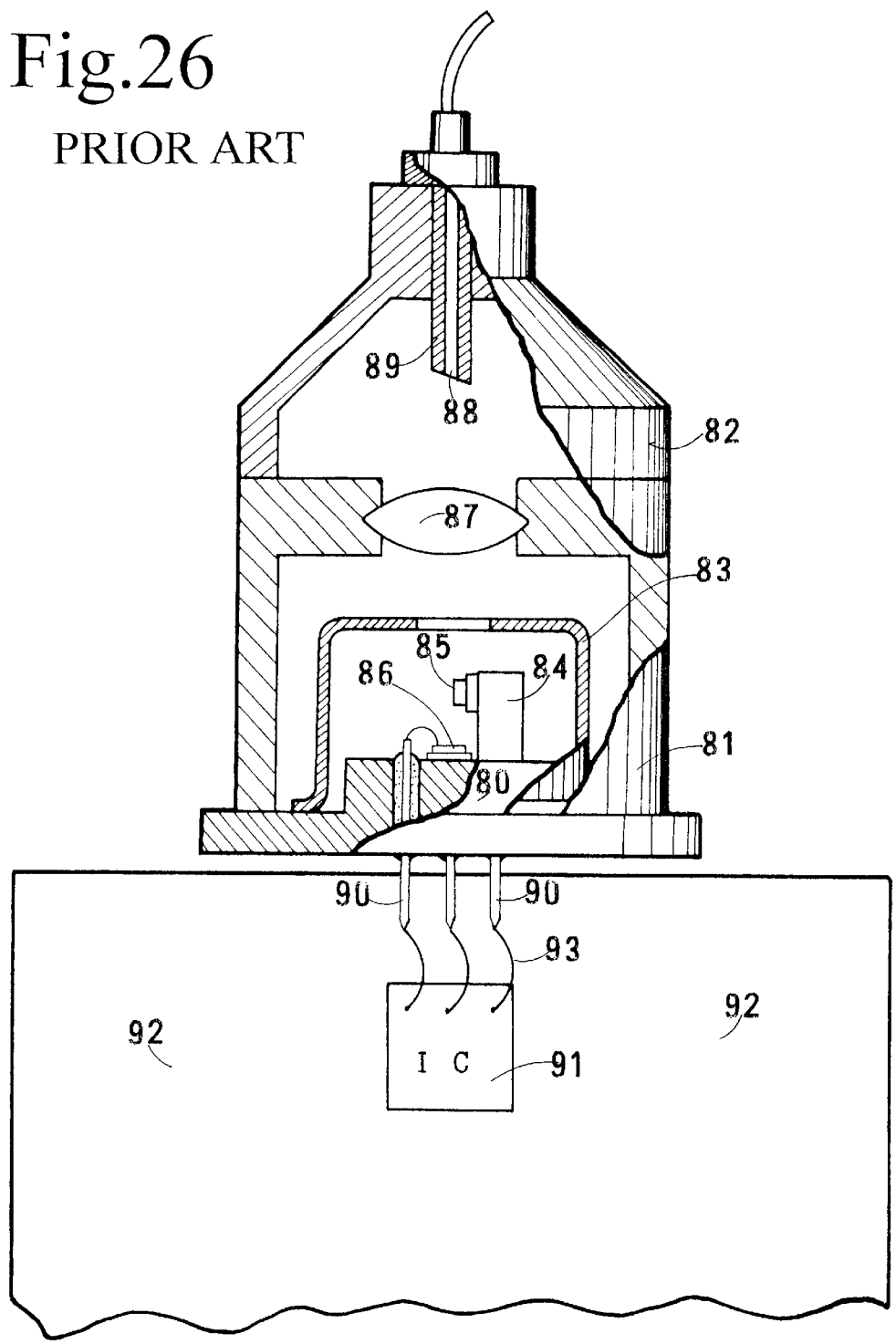
FIG. 26 is a section of one of the most prevalent LD modules with three dimensional structure stored in a cylindrical metallic package and an LD driving IC fitted upon a separated print circuit board.
Figure 27:
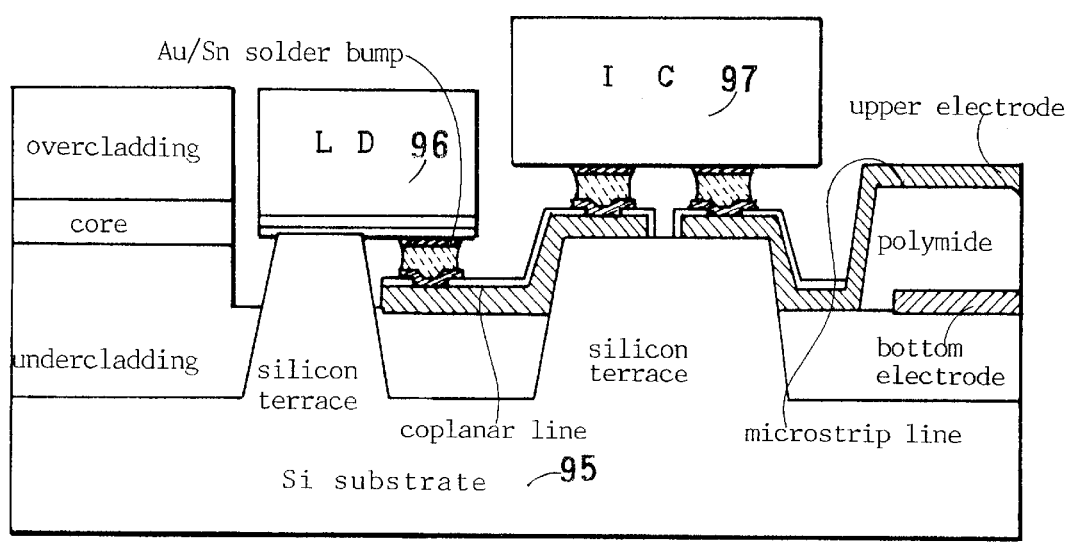
FIG. 27 is a section of a prior art LD module proposed by Y Akahori, T. Ohyama, M. Yanagisawa, Y. Yamada, H. Tsunetsugu, Y. Akatsu, M. Togashi, S. Mino and Y. Shibata, "A HYBRID HIGH-SPEED SILICA-BASED PLANAR LIGHTWAVE CIRCUIT PLATFORM INTEGRATING A LASER DIODE AND A DRIVER IC", ECOC 97, Sep. 22–25, 1997, Conference Publication No. 448, IEE, 1997, p 359–362.

The LD driving IC supplies the driving current to the LD via the wire 51, the n-electrode 44, the metallized pattern 43, and the wire 52. The access of the IC to the LD reduces wiring length. The total wiring length between the LD 34 and the IC 40 is still shorter than the LD/IC wiring of the current prevalent module of FIG. 26. The shortened path reduces the inductance L of the wirings. The impedance $jL\omega$ due to the wiring is curbed by the reduction of the wiring length. Decline of the wiring impedance allows the LD module to decrease the signal distortion. A reduction of the signal distortion enables the optoelectronic communications to carry signals at a higher transmission rate.

The sizes of the LD, PD and IC chips are described. An LD chip 34 has, e.g., a length of 300 μm to 800 μm and a width of 200 μm to 500 μm. The LD driving IC chip 40 is a square of a 800 μm to 1500 μm side. The monitoring PD 36 is a square of a side of 400 μm to 600 μm.

The lightguiding groove 32 formed upon the silicon substrate 31 for introducing the rear light to the PD 36 has a width of 150 μm to 300 μm and a depth of 150 μm to 300 μm. The detour groove 32 has either a triangle section with two banks or an isosceles trapezoid section with two banks and a narrow bottom.

The lightguiding groove 32 is preferably plated with gold (Au) for reflecting the LD rear light to the bottom of the PD with high efficiency. The length of the lightguiding groove 32 is 1000 μm to 2000 μm. Several times of reflection lead the LD rear light to the PD 36.

For the purpose of monitoring the LD power, it is unnecessary to inject 100% of the rear light to the PD 36. A catch of 10% of the rear light is sufficient for the PD to monitor the LD power.

Embodiment 1 of FIGS. 1 and 2 employs a bottom incidence type PD having a wide aperture of 200 μm to 400 μm. The wide aperture favors the present invention relying upon a detour, because almost all of the light reflected by the detour groove enters the PD 36.

Figure 3:
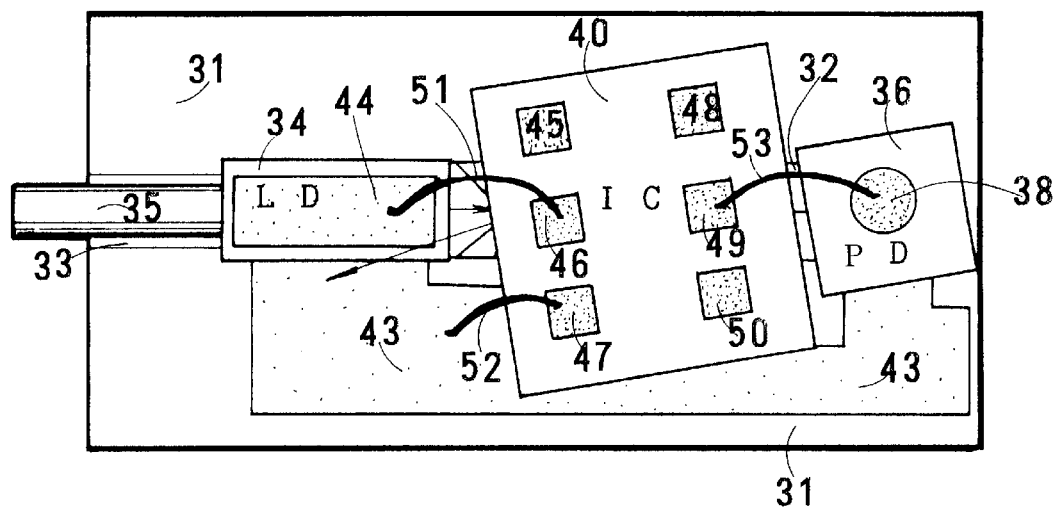
FIG. 3 is a plan view of an improvement of Embodiment 1 including a silicon bench having a front open V-groove and an intermediate lightguiding groove, an LD epi-down mounted upon a plateau between the front V-groove and the medium lightguiding groove, an LD driving IC skewing to beam line and being mounted on the substrate over the lightguiding groove and a bottom incidence type monitoring PD skewing to beam line and being mounted over an end of the lightguiding groove.

Improvement of Embodiment 1
(Skewing IC, Skewing PD; FIG. 3)

Instability is induced in the LD, if the LD light is reflected by the IC or the PD and is returned to the LD. The LD instability induced by the returning light is a well-known phenomenon. Embodiment 1 has a probability of causing return of the LD light reflected by the IC or the PD, since the surfaces of the IC and the PD are orthogonal to the beam line.

FIG. 3 shows an improvement of Embodiment 1 skewing the IC 40 and the PD 36 at three degrees to ten degrees. The skewing fronts forbid the reflected light from returning to the LD. Such skewing IC and PD are also available to the following embodiments 2 to 12. Although the skewed IC and PD are not drawn in the figures of the embodiments 2 to 12, the embodiments also include the IC/PD skewing versions.

The actual dimensions of the chips of Embodiment 1 are;
LD=1.3 μm-DFB-LD 300 μm×300 μm
IC=LD driving IC of Si 1000 μm×1000 μm
PD=bottom incidence type InGaAs-PD 550 μm×550 μm (effective aperture=300 μm)
Lightguiding groove=250 μm width, 180 μm depth, 1600 μm length,
silicon bench=1.5 mm width, 5 mm length, 1 mm thickness Embodiment 1 is actually assembled for investigating the effects of the present invention. The IC and the PD are skewed at ten degrees to the beam line. The lightguiding groove is potted with a transparent silicone resin with a refractive index of 1.42. Other part is covered with opaque epoxy resin. The driving IC injects current to the LD. The LD emits light in both directions. When the output power of the fiber is 1 mW, the monitoring PD produces 300 μA as a monitoring current which is sufficient for the IC to control the LD exactly.

The maximum of transmittable signal rate is measured to be 5 Gbps to 10 Gbps. The present invention is proved to be quite effective for high speed transmission.

The LD diving IC is a silicon IC in Embodiment 1. But the Si type driving IC can be replaced by a GaAs-IC or an InP-IC. The InP type LD of Embodiment 1 can be also replaced by a GaAs-LD or by an LD produced from complex materials including GaAs. The PD is an InP-PD in Embodiment 1. The InP-PD can be also replaced by a GaAs-PD, Ge-PD or Si-PD.

Figure 4:
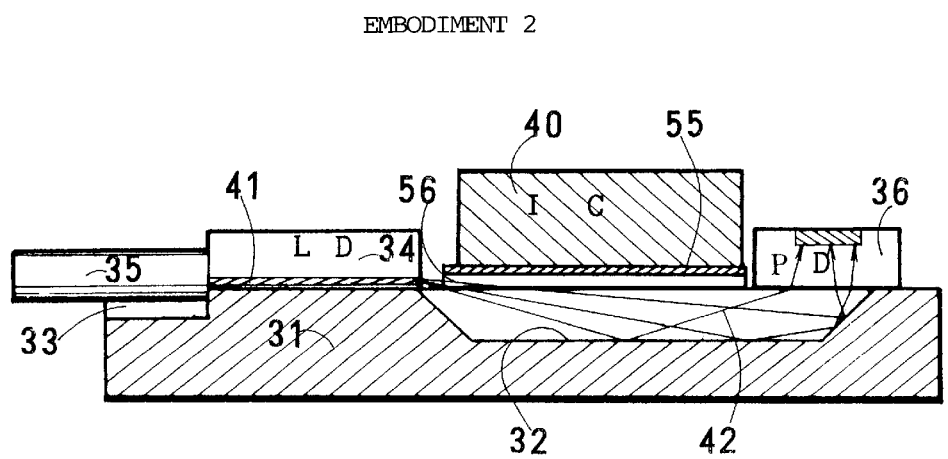
FIG. 4 is a sectional view of an LD module as Embodiment 2 including a silicon bench having a front open V-groove and an intermediate lightguiding groove, an LD epi-down mounted upon a plateau between the front V-groove and the medium lightguiding groove, a tunnel-cavity carrying submount mounted on the substrate over the lightguiding groove, an LD driving IC bonded upon the submount and bottom incidence type monitoring PD mounted over an end of the lightguiding groove for receiving rear LD light reflected and detoured by the lightguiding groove.
Figure 5:
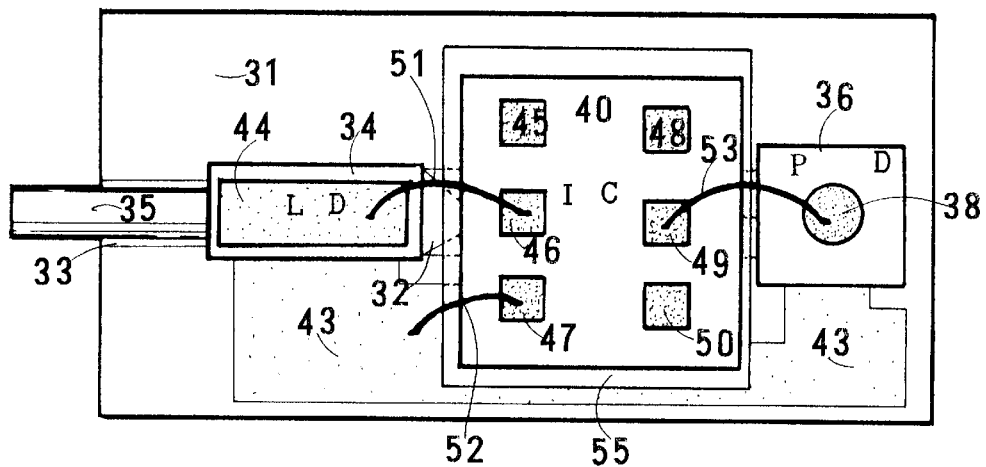
FIG. 5 is a plan view of an LD module as Embodiment 2 including a silicon bench having a front open V-groove and an intermediate lightguiding groove, an LD epi-down mounted upon a plateau between the front V-groove and the medium lightguiding groove, a tunnel-cavity carrying submount mounted on the substrate over the lightguiding groove, an LD driving IC bonded upon the submount and bottom incidence type monitoring PD mounted over an end of the lightguiding groove.

Embodiment 2
(Bottom Incidence Type PD; Lightguiding Groove; Cavity-Submount; FIGS. 4, 5)

Embodiment 1 of FIGS. 1 and 2 has a drawback of that the horizontal beam emanating from the rear LD end is shielded by the front end of the IC and does not arrive at the PD. The horizontal beam is a loss. Stronger monitoring current is more favorable for the IC to control the LD more exactly. Embodiment 2 aims at reducing the loss beams by mounting the IC on a submount having a tunnel cavity allowing the horizontal beam to pass through. The submount is made from alumina ($Al_2O_3$), copper (Cu) or brass. The tunnel cavity submount enables the PD to increase the monitoring current by about several tens of percent.

FIG. 4 is a vertically-sectioned view of Embodiment 2. FIG. 5 is a plan view. A silicon substrate 31 has a front open V-groove 33 and a lightguiding groove 32 along an axial line (beam line). Like Embodiment 1, an LD 34 is upside down mounted on a plateau between the front V-groove 33 and the lightguiding groove 32. A fiber 35 is fitted in the front V-groove 33. A bottom incidence type monitoring photodiode (PD) 36 is bonded on the substrate 31 over the rear end of the lightguiding groove 32. An additional part in Embodiment 2 is a submount 55 having a tunnel cavity 56 on the bottom. The submount 55 is fitted with the cavity below on the substrate 31 over the lightguiding groove 32. The tunnel cavity 56 makes a new path which permits a horizontal beam emanating from the rear end of the LD to pass through. Since the effective aperture from the LD is increased upward by the tunnel-cavity submount, the monitoring photocurrent in the PD is increased, which enhances the preciseness of an IC 40 to control the LD.

The LD driving IC 40 is close to the LD 34. An electrode pad 46 of the driving IC 40 is joined to a pad 44 of the LD 34 by a short wire 51. The lower electrode (anode; p-electrode) of the LD 34 is directly soldered to a metallized patten 43 on the substrate 31 (source voltage Vcc). A short wire 52 joins the metallized patten 43 to a pad 47 of the IC 40. The LD and the IC are connected by the short wires 51, 52 and short portion of the pattern 43. The inductance of the wirings is decreased. The signal distortion is suppressed. The signal delay is alleviated. Embodiment 2 has an extra merit of the enhanced monitoring current by increasing the detour light through the tunnel cavity submount 55.

The wires are, for example, golden (Au) wires or aluminum (Al) wires of a 30 μm diameter. The 30 μm diameter wire has an induction (L) of about 1 nH (nano henry) per a 1 mm length. A 2 mm reduction of the wire decreases the induction by 2 nH. In Embodiment 2, the fiber, the LD, the IC, the lightguiding groove and the PD are covered with a transparent potting resin. The potting resin is, for example, a silicone resin of a refractive index of 1.42. The transparent resin ensures the light path and reduces the reflection at the interfaces. The transparent rein is also used for covering the light paths in the following embodiments.

The submount 55 is shaped for having the tunnel cavity on the bottom for enhancing the detour light. The tunnel is higher than the central beam line of the rear LD. The cavity 56 widens the effective paths between the LD and the PD. The stronger light increases the monitoring current in the PD. The tunnel cavity submount succeeds in increasing the monitoring current by 10% higher than Embodiment 1.

Figure 6:
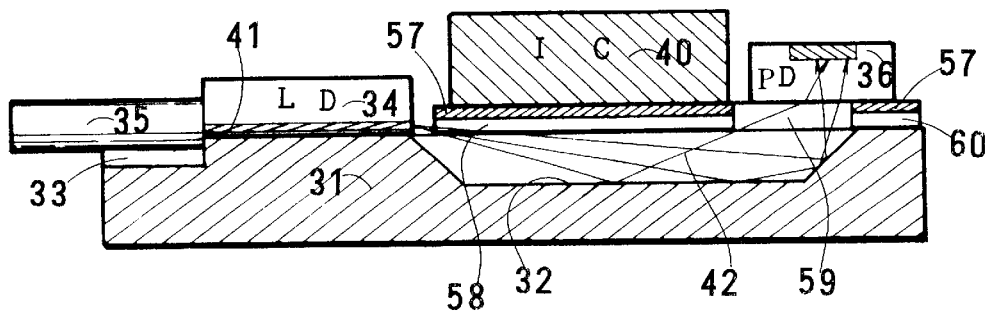
FIG. 6 is a sectional view of an LD module as Embodiment 3 including a silicon bench having a front open V-groove and an intermediate lightguiding groove, an LD epi-down mounted upon a plateau between the front V-groove and the medium lightguiding groove, a long tunnel-cavity carrying submount mounted on the substrate over the lightguiding groove, an LD driving IC bonded upon the submount and a bottom incidence type monitoring PD mounted on the same submount fitted over the end of the lightguiding groove for receiving rear LD light reflected and detoured by the lightguiding groove.
Figure 7:
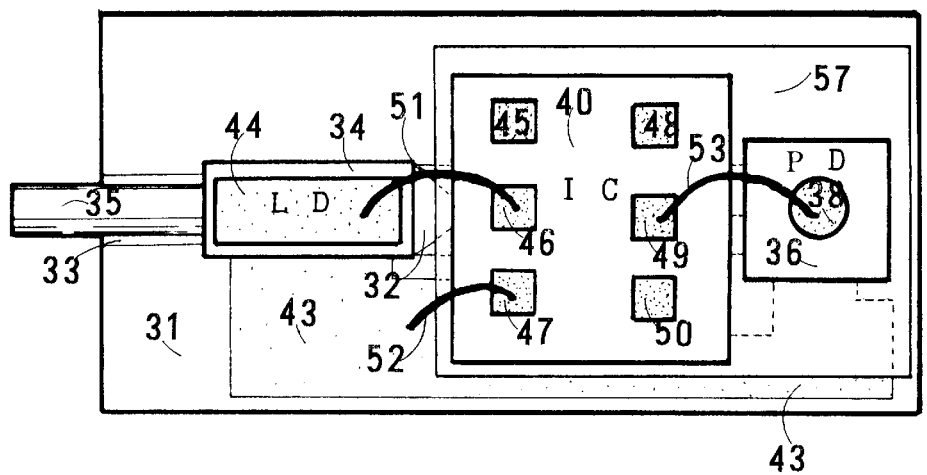
FIG. 7 is a plan view of an LD module as Embodiment 3 including a silicon bench having a front open V-groove and an intermediate lightguiding groove, an LD epi-down mounted upon a plateau between the front V-groove and the medium lightguiding groove, a long tunnel-cavity carrying submount being mounted on the substrate over the lightguiding groove and being extended near the end of the substrate, an LD driving IC bonded upon the submount and a bottom incidence type monitoring PD mounted on the same submount fitted over the end of the lightguiding groove.

Embodiment 3
(Bottom Incidence Type PD; Lightguiding Groove; Extension of Submount; FIGS. 6, 7)

Embodiment 2 places only the IC upon the cavity-carrying submount. If the submount is further extended, the PD can be also mounted upon the submount. Embodiment 3 is clarified by referring to FIG. 6 and FIG. 7.

Embodiment 3 also makes use of a submount 57 having a tunnel cavity. The submount 57 is longer than that of Embodiment 2. The submount 57 has a front cavity 58 and a rear cavity 60 on the bottom. A hole 59 is pierced in the vertical direction between the front cavity 58 and the rear cavity 60. A vertical hole 59 is necessary to introduce reflected beams into a bottom incidence type monitoring PD 36. The submount 57 is made from plastics, metals or ceramics.

A driving IC 40 and the PD 36 are in series mounted upon the long submount 57. An LD rear beams 42 are reflected by a lightguiding groove 32 and are guided into the bottom of the PD via the hole 59.

Like Embodiment 2, since the IC is lifted by the cavity-submount, the monitoring current is increased.

Figure 8:
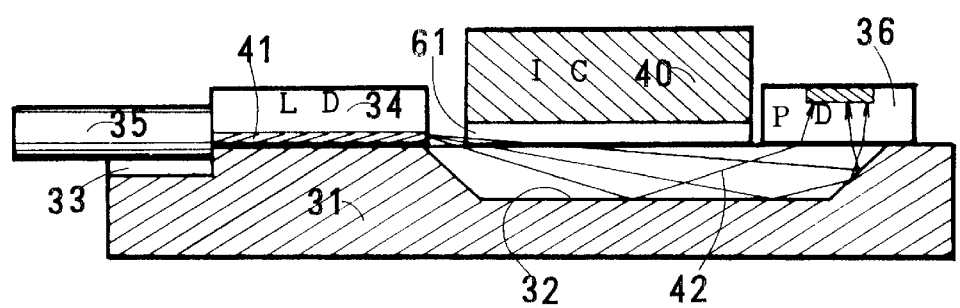
FIG. 8 is a sectional view of an LD module as Embodiment 4 including a silicon bench having a front open V-groove and an intermediate lightguiding groove, an LD epi-down mounted upon a plateau between the front V-groove and the medium lightguiding groove, an LD driving IC having a longitudinal bottom groove and being bonded upon the substrate and a bottom incidence type monitoring PD mounted on the silicon bench for receiving rear LD light reflected and detoured by the lightguiding groove.
Figure 9:
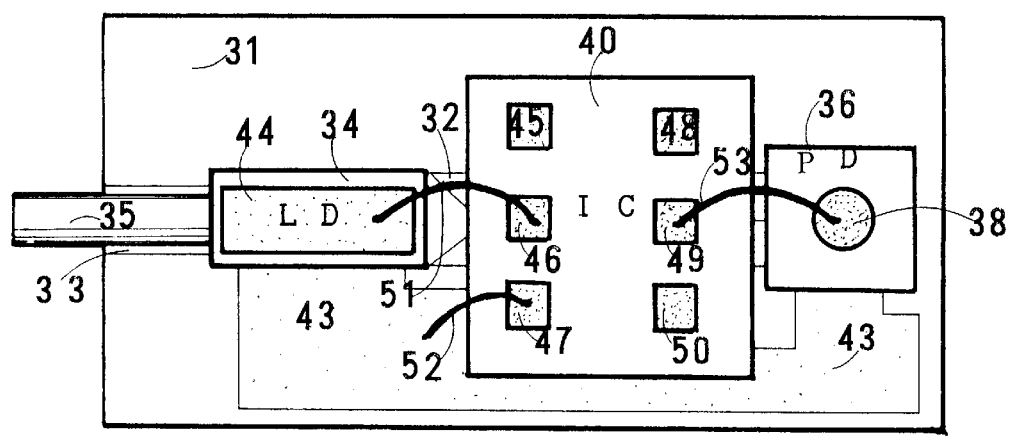
FIG. 9 is a plan view of an LD module as Embodiment 4 including a silicon bench having a front open V-groove and an intermediate lightguiding groove, an LD epi-down mounted upon a plateau between the front V-groove and the medium lightguiding groove, an LD driving IC having a longitudinal bottom groove and being bonded upon the substrate and a bottom incidence type monitoring PD mounted on the silicon bench.

Embodiment 4
(Bottom Incidence Type PD; Lightguideing Groove; Bottom Groove on the IC; FIGS. 8, 9)

Instead of the cavity-carrying submount, Embodiment 4 increases the detour light by shaping a vertical groove on the bottom of the IC.

FIG. 8 and FIG. 9 show Embodiment 4 having a silicon substrate 31 with an open front V-groove 33 and a lightguiding groove 32 along an axial beam line. An LD 34 is epi-down (upside down) mounted upon a plateau between the V-groove 33 and the lightguiding groove 32. A bottom incidence type monitoring PD 36 is bonded on the silicon substrate 31 over a rear end of the lightguiding groove 32. Such an arrangement is similar to Embodiment 1. What is different is the shape of an LD driving IC 40. A longitudinal groove 61 is perforated along the center line on the bottom of the IC 40. The IC with the bottom groove is bonded on the silicon substrate 31 over the lightguiding groove 32. The aperture of the rear LD beams is enlarged by the longitudinal bottom groove 61. Stronger detour LD rear beams can attain at the PD 36 than Embodiment 1. The bottom groove 61 allows the PD to obtain bigger monitoring current without an extra part. Embodiment 4 has the same advantage as Embodiments 2 and 3. Embodiment 4 dispenses with the submount 55 or 57 in Embodiment 2 and 3.

Figure 10:
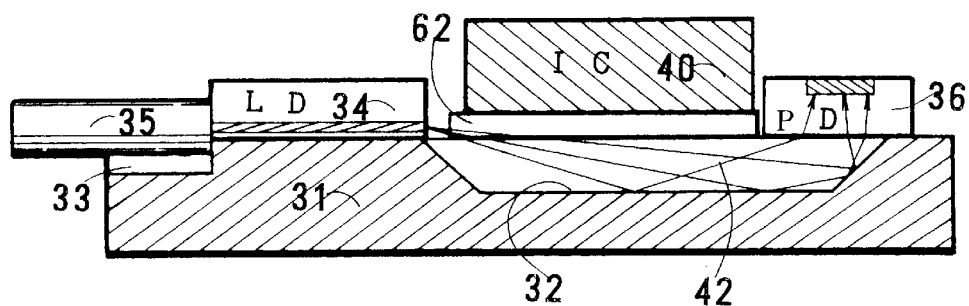
FIG. 10 is a sectional view of an LD module as Embodiment 5 including a silicon bench having a front open V-groove and an intermediate lightguiding groove, an LD epi-down mounted upon a plateau between the front V-groove and the medium lightguiding groove, a transparent submount mounted on the substrate over the lightguiding groove, an LD driving IC bonded upon the transparent submount and a bottom incidence type monitoring PD mounted over an end of the lightguiding groove on the substrate for receiving rear LD light reflected and detoured by the lightguiding groove.
Figure 11:
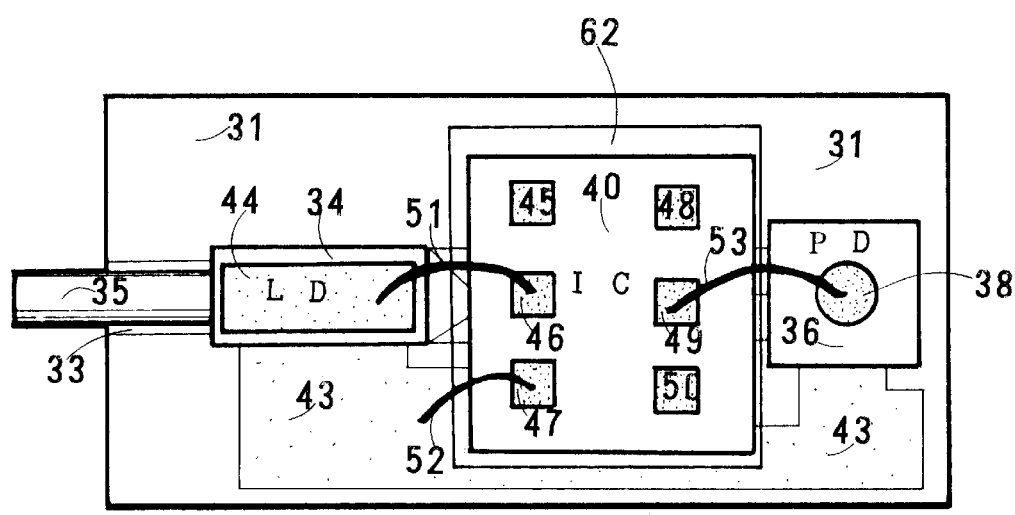
FIG. 11 is a plan view of an LD module as Embodiment 5 including a silicon bench having a front open V-groove and an intermediate lightguiding groove, an LD epi-down mounted upon a plateau between the front V-groove and the medium lightguiding groove, a transparent submount being mounted on the substrate over the lightguiding groove, an LD driving IC bonded upon the transparent submount and a bottom incidence type monitoring PD mounted over an end of the lightguiding groove on the substrate for receiving rear LD light reflected and detoured by the lightguiding groove.

Embodiment 5
(Bottom Incidence Type PD; Lightguiding Groove; Transparent Submount; FIGS. 10, 11)

Embodiments 2 and 3 lift the IC by the tunnel-cavity submount to widen the aperture of the LD rear beams. Embodiment 4 forms the longitudinal groove on the bottom of the IC for widening the aperture. Embodiment 5 tries to increase the aperture of the LD rear beams and enhance the monitoring current by lifting the IC by a transparent submount. A bottom incidence type PD 36 is bonded on the silicon bench over the end of the lightguiding groove 32.

FIG. 10 and FIG. 11 show a transparent submount 62 fitted upon the lightguiding groove 32. An LD driving IC 40 is bonded upon the transparent submount 62. The transparent submount 62 is made from silica glass, transparent ceramics or transparent plastics (e.g., PMMA). The transparent submount enables an extra part of the LD rear beams 42 to pass below the IC and to raise the monitoring current.

Figure 12:
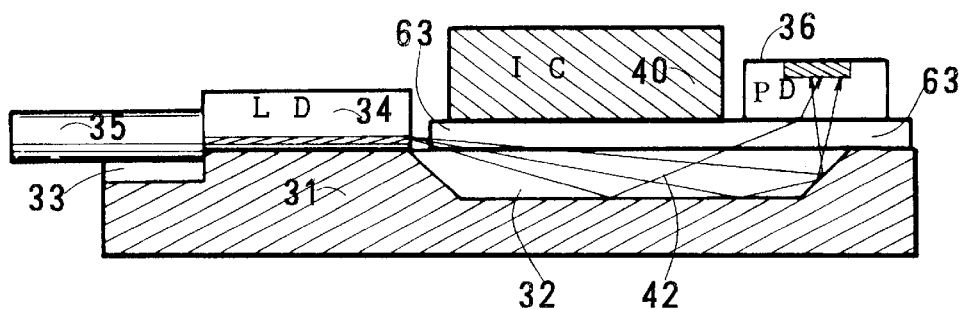
FIG. 12 is a sectional view of an LD module as Embodiment 6 including a silicon bench having a front open V-groove and an intermediate lightguiding groove, an LD epi-down mounted upon a plateau between the front V-groove and the medium lightguiding groove, a long transparent submount being mounted on the substrate over the lightguiding groove, an LD driving IC bonded upon the transparent submount and a bottom incidence type monitoring PD mounted on the same transparent submount fitted over the end of the lightguiding groove for receiving rear LD light reflected and detoured by the lightguiding groove.
Figure 13:
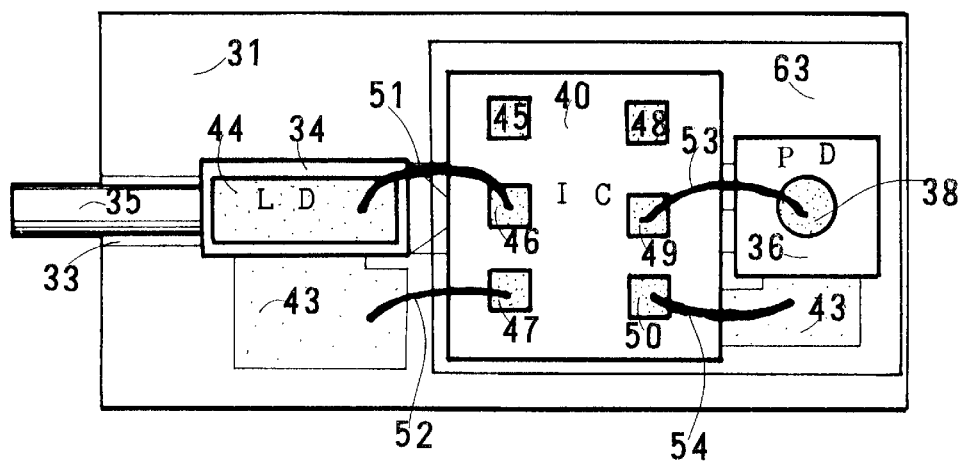
FIG. 13 is a plan view of an LD module as Embodiment 6 including a silicon bench having a front open V-groove and an intermediate lightguiding groove, an LD epi-down mounted upon a plateau between the front V-groove and the medium lightguiding groove, a long transparent submount being mounted on the substrate over the lightguiding groove, an LD driving IC bonded upon the transparent submount and a bottom incidence type monitoring PD mounted on the same transparent submount fitted over the end of the lightguiding groove.

Embodiment 6
(Bottom Incidence Type PD; Lightguiding Groove; Long Transparent Submount; FIGS. 12, 13)

FIG. 12 and FIG. 13 show Embodiment 6 which puts a long transparent submount 63 extending till the backmost on a rear half of the substrate over a lightguiding groove 32. An LD driving IC 40 and a bottom incidence type PD 36 are bonded on the extended transparent submount 63. A rise of the PD increases the incidence light power.

Figure 14:
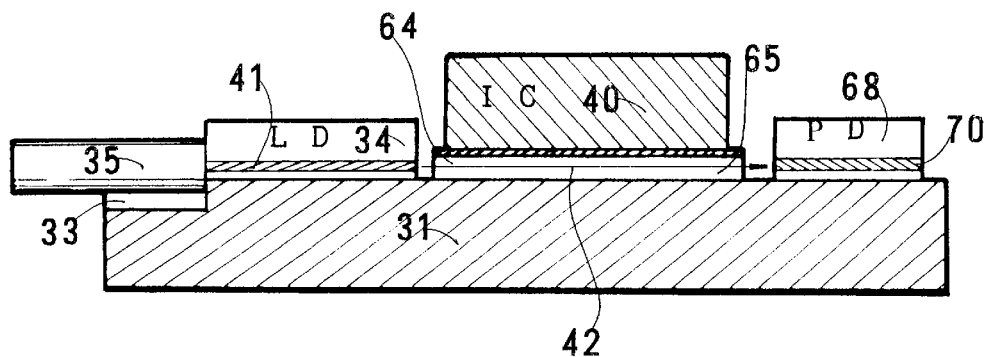
FIG. 14 is a sectional view of an LD module as Embodiment 7 including a silicon bench having a front open V-groove, an LD epi-down mounted upon a plateau following the front V-groove, a tunnel-cavity carrying submount mounted on the substrate following the LD, an LD driving IC bonded upon the tunnel-cavity carrying submount and a front end incidence type monitoring PD following the IC and being mounted on the substrate for receiving rear LD light passing through the tunnel cavity below the IC.
Figure 15:
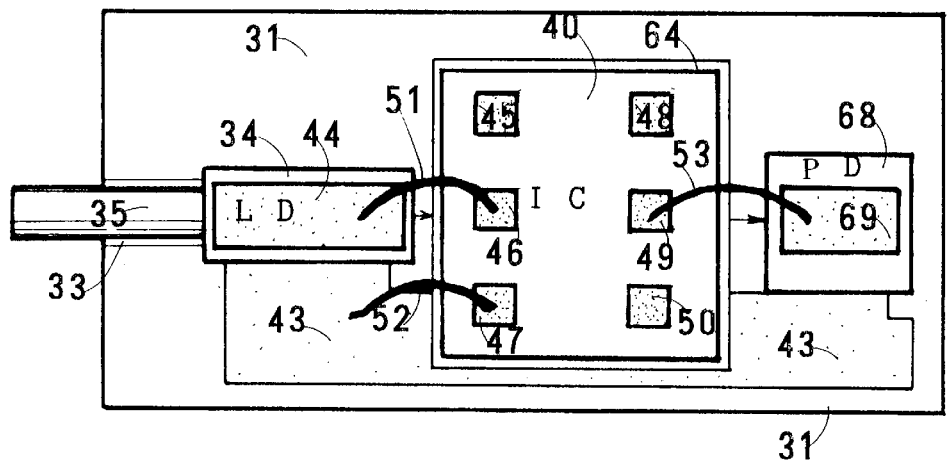
FIG. 15 is a plan view of an LD module as Embodiment 7 including a silicon bench having a front open V-groove, an LD epi-down mounted upon a plateau following the front V-groove, a tunnel-cavity carrying submount mounted on the substrate following the LD, an LD driving IC bonded upon the tunnel-cavity carrying submount and a front end incidence type monitoring PD following the IC and being mounted on the substrate.

Embodiment 7
(Front End Incidence Type PD; Cavity-Carrying Submount; FIGS. 14, 15)

Instead of the bottom incidence type PDs, the present invention can be applied to the LD modules containing the front end incidence type PDs.

Embodiment 7 built on a silicon substrate 31 is shown by FIGS. 14 and 15. The silicon substrate 31 has only a front open V-groove 33. The front end incidence requires no lightguiding groove. A fiber 35 is fitted in the front V-groove 33. An LD 34 is upside down (epi-down) mounted on a plateau following the V-groove 33. A rectangular submount 64 having a tunnel cavity 65 on the bottom is fitted on the substrate 31 following the LD 34. The tunnel cavity 65 makes a path which permits a horizontal beam emanating from the rear end of the LD 34 to pass through. A front end incidence type monitoring photodiode (PD) 68 is epi-down (upside down) bonded on the backmost end of the substrate 31.

An emission region 41 of the LD 34 and the cavity 65 of the submount 64 align along an extension of a core of a fiber 35. The strongest horizontal beam 42 emanating from the rear end of the LD 34 straightly passes in the cavity 65, arrives at a sensing layer 70 of the PD 68 and makes monitoring photocurrent.

As shown in FIG. 15, an electrode pad 46 of a driving IC 40 is joined to a pad 44 of the LD 34 by a short wire 51. An lower electrode (anode; p-electrode) of the LD 34 is directly soldered to a metallized patten 43 on the substrate 31 (source voltage Vcc). A short wire 52 joins the metallized patten 43 to a pad 47 of the IC 40. The LD 34 and the IC 40 are connected by the short wires 51, 52 and short portion of the pattern 43. The inductance of the wirings is decreased. The signal distortion is suppressed. The signal delay is alleviated.

Furthermore, the waveguide detouring by the cavity-carrying submount is not restricted to the front end incidence type PD but can be also applied to a bottom incidence type PD (not shown). The LD module has the LD and the IC arranged in the same series on the silicon bench as the case of the front end incidence PD. A second skewing submount with a skewing mirror surface is glued at the backmost of the substrate. A bottom incidence PD is epi-up bonded upon the skewing submount. The LD, the waveguide submount, the skesing submount and the PD are covered with a transparent resin.

The submount allows the LD rear beams to pass in the waveguide beneath the IC. The rear beams which are reflected by the skewing mirror go upward into the PD and arrive at the sensing layer.

Figure 16:
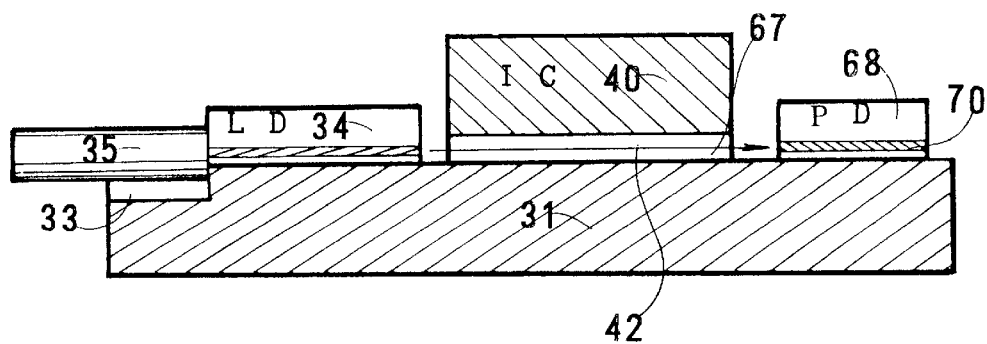
FIG. 16 is a sectional view of an LD module as Embodiment 8 including a silicon bench having a front open V-groove, an LD epi-down mounted upon a plateau following the front V-groove, an LD driving IC with a bottom longitudinal groove being bonded upon the substrate and a front end incidence type monitoring PD following the IC and being mounted on the substrate for receiving rear LD light passing through the bottom longitudinal groove of the IC.
Figure 17:
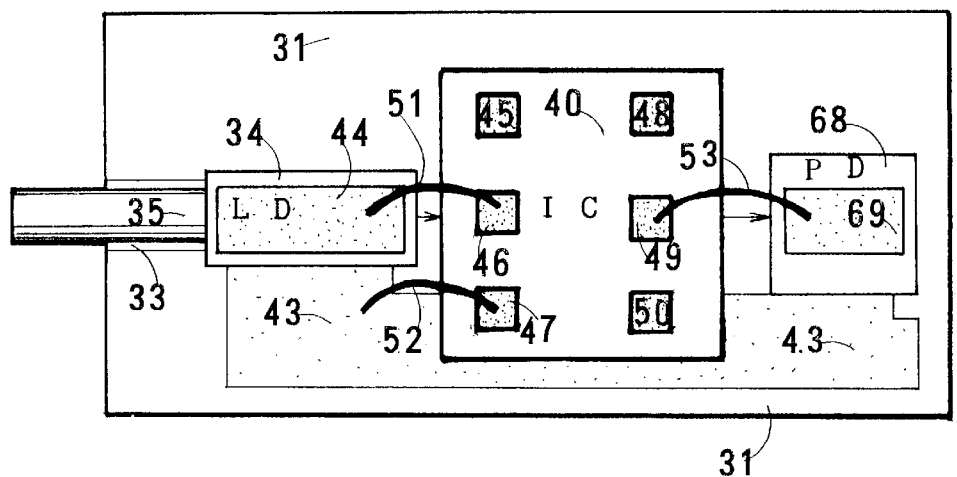
FIG. 17 is a plan view of an LD module as Embodiment 8 including a silicon bench having a front open V-groove, an LD epi-down mounted upon a plateau following the front V-groove, an LD driving IC with a bottom longitudinal groove being bonded upon the substrate and a front end incidence type monitoring PD following the IC and being mounted on the substrate.

Embodiment 8
(Front End Incidence Type PD; Bottom Groove of IC; FIGS. 16, 17)

The cavity-carrying submount can be omitted. Embodiment 8 forms a longitudinal groove on the bottom of an LD driving IC for eliminating the submount. FIG. 16 and FIG. 17 show the LD driving IC 40 with a bottom groove 67. Instead of the cavity of the submount, the longitudinal bottom groove allows the LD rear beams 42 to pass and arrive at a front end incidence type PD 70. Removal of the submount cuts the parts cost down.

The waveguide submount is not restricted to the front end incidence type PD but can be also applied to a bottom incidence type PD (not shown). The LD module has the LD and the PD arranged on the silicon bench in the same series as the case of the front end incidence PD. A second skewing submount with a skewing mirror surface is glued at the backmost of the substrate. The bottom incidence PD is epi-up bonded upon the skewing submount. The LD, the bottom groove of IC, the skewing submount and the PD are covered with a transparent resin.

The submount allows the LD rear beams to pass in the waveguide beneath the IC. The rear beams which are reflected by the skewing mirror go upward into the PD and arrive at the sensing layar.

Embodiment 9
(Front End Incidence Type PD; Transparent Waveguide-Submount; FIGS. 18, 19)

FIG. 18 and FIG. 19 show Embodiment 9. The cavity-carrying submount of Embodiment 7 can be replaced by a submount 71 having a waveguide 72. An LD driving IC 40 is mounted upon the submount 71. A front end incidence type PD 68 is epi-down fitted on the rear end of a silicon bench 31. An LD 34, the IC 40 and the PD 68 are aligned along an extension of a core of a fiber 35. Instead of the cavity of the submount, the waveguide 72 produced on the submount 71 allows the LD rear beams 42 to pass and arrive at a sensing layer 70 of the PD 68. The use of the waveguide having a converging function enhances the monitoring current of the PD 68. The waveguide can be made on a silicon crystal.

Thus, the submount with the waveguide can be combined with the main silicon substrate. A unified submount/substrate is produced by producing a waveguide along a central beam line on a rectangular silicon substrate, etching a peripheral part of the waveguide-made silicon bench by a depth more than the waveguide thickness except a small rectangle for a submount, producing a front open V-groove. Like the preceding embodiments, the short wiring between the LD 34 and the IC 40 enables the LD module to curb the delay or the distortion of signal pulses.

Figure 20:
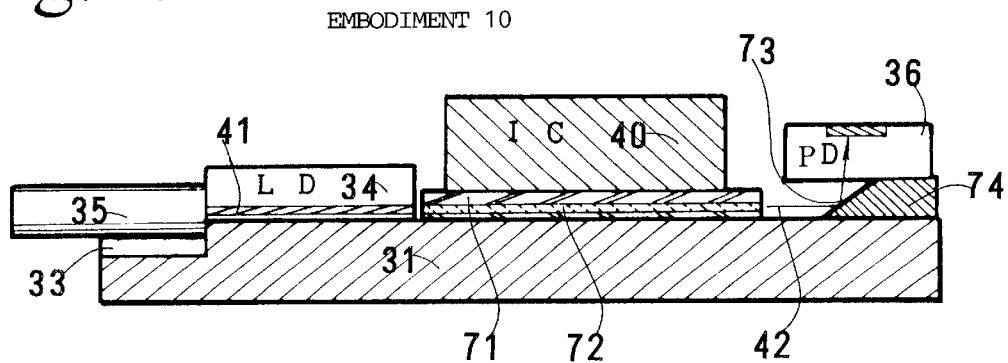
FIG. 20 is a sectional view of an LD module as Embodiment 10 including a silicon bench having a front open V-groove, an LD epi-down mounted upon a plateau following the front V-groove, a submount with a waveguide being mounted on the substrate following the LD, an LD driving IC bonded upon the waveguide-carrying submount, a submount with a front slanting bank fitted on an end of the substrate and a bottom incidence type monitoring PD following the IC and being mounted on the submount for receiving rear LD light passing through the waveguide and turning to the PD at the bank of the submount.
Figure 21:
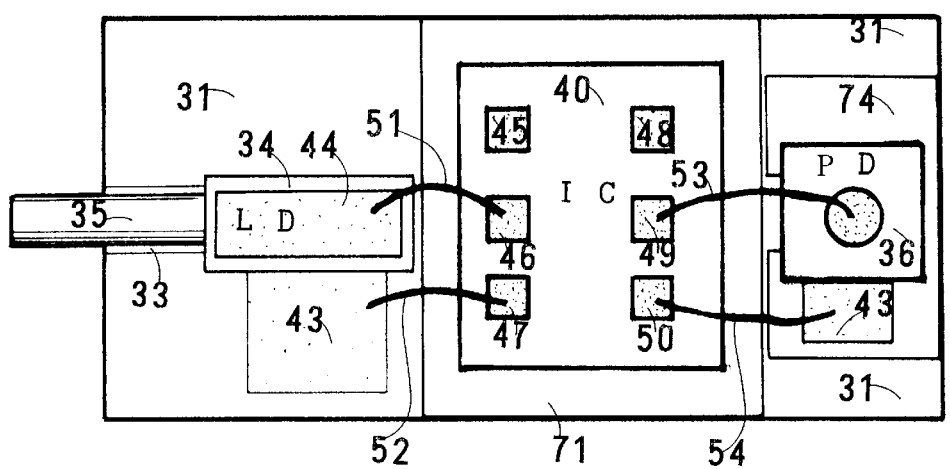
FIG. 21 is a plan view of an LD module as Embodiment 10 including a silicon bench having a front open V-groove, an LD epi-down mounted upon a plateau following the front V-groove, a submount with a waveguide being mounted on the substrate following the LD, an LD driving IC bonded upon the waveguide-carrying submount, a submount with a front slanting bank fitted on an end of the substrate and a bottom incidence type monitoring PD following the IC and being mounted on the submount.

Embodiment 10
(Bottom Incidence Type PD; Transparent Waveguide-Submount; FIGS. 20, 21)

The waveguide detouring is not restricted to a front end incidence type PD but can be also applied to a bottom incidence type PD. FIG. 20 and FIG. 21 show Embodiment 10 which is built by an assembly of a waveguide submount and a bottom incidence PD. A fiber 35 is fixed in a V-groove 33. An LD 34 is epi-down fitted on a substrate 31 following the fiber. A submount 71 having a waveguide 72 is bonded on the substrate 31 at the back of the LD 34. An LD driving IC 40 is mounted upon the submount 71. A second skewing submount 74 with a skewing mirror surface 73 is glued at the backmost of the substrate 31. A bottom incidence PD 36 is epi-up bonded upon the submount 74. The LD 34, the waveguide submount 71, the skewing submount 74 and the PD 36 are covered with a transparent resin.

The submount 71 allows the LD rear beams to pass beneath the IC 40. The rear beams which are reflected by the skewing mirror 73 go into the PD and arrive at the sensing layer. Instead of employing discrete submounts 71 and 74, the submounts 71 and 74 can be produced as parts of the silicon bench from a silicon single crystal substrate.

Figure 22:
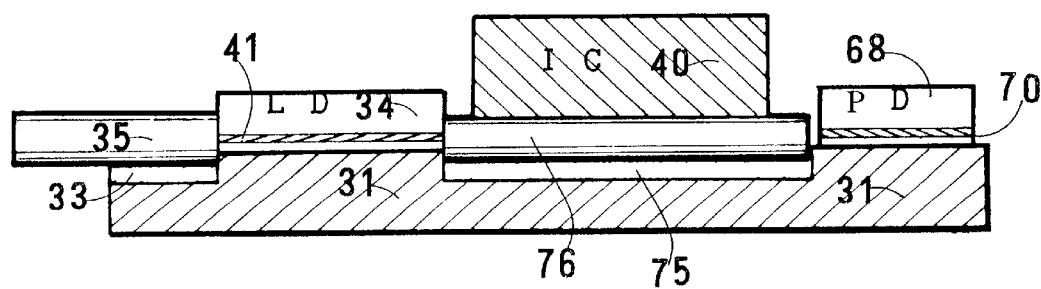
FIG. 22 is a sectional view of an LD module as Embodiment 11 including a silicon bench having a front open V-groove and an intermediate V-groove, an LD epi-down mounted upon a plateau following the front V-groove, a fiber inserted in the intermediate V-groove, an LD driving IC bonded on the substrate over the fiber-containing V-groove and a front end incidence type monitoring PD being mounted on the substrate following the fiber for receiving rear LD light passing through the fiber.
Figure 23:
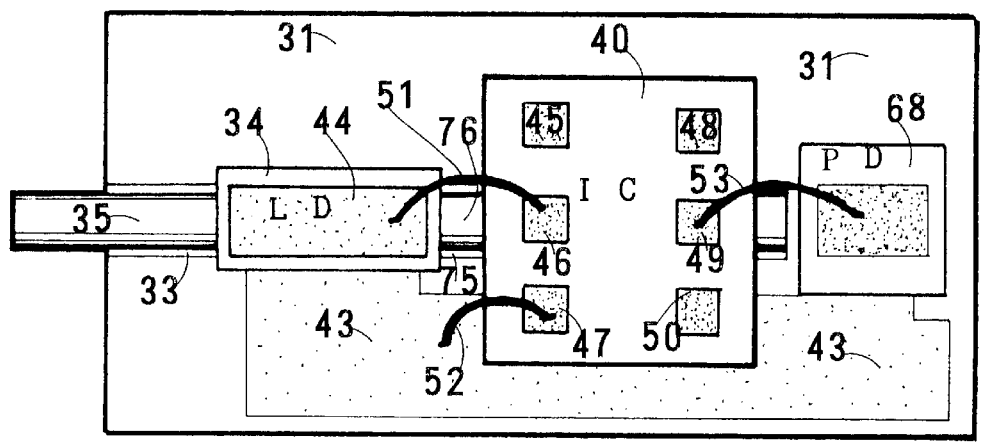
FIG. 23 is a plan view of an LD module as Embodiment 11 including a silicon bench having a front open V-groove and an intermediate V-groove, an LD epi-down mounted upon a plateau following the front V-groove, a fiber inserted in the intermediate V-groove, an LD driving IC bonded on the substrate over the fiber-containing V-groove and a front end incidence type monitoring PD being mounted on the substrate following the fiber.

Embodiment 11
(Front End Incidence Type PD; Optical Fiber; FIGS. 22, 23)

Embodiment 11 employs an optical fiber as a detour and a front end incidence type PD as a monitoring PD. FIG. 22 and FIG. 23 show a silicon substrate 31 having a front open V-groove 33 and an intermediate closed V-groove 75. A fiber 35 is fixed in the front V-groove 33. An LD 34 is epi-down fitted on the substrate following the fiber 35. A detouring fiber 76 is inserted into the intermediate V-groove 75. An LD driving IC 40 is mounted upon the substrate 31 above the detouring fiber 76. A front incidence PD 68 is epi-down bonded at the backmost on the substrate 31. An emission stripe 41 of the LD 34, the fiber 76 and a sensing region 70 of the PD 68 are aligned along an extension of the fiber 35. The LD 34, the fiber 76, the V-groove 75 and the PD 68 are covered with a transparent resin. The detouring fiber 76 guides LD rear beams beneath the IC 40 to the PD 68.

Figure 24:
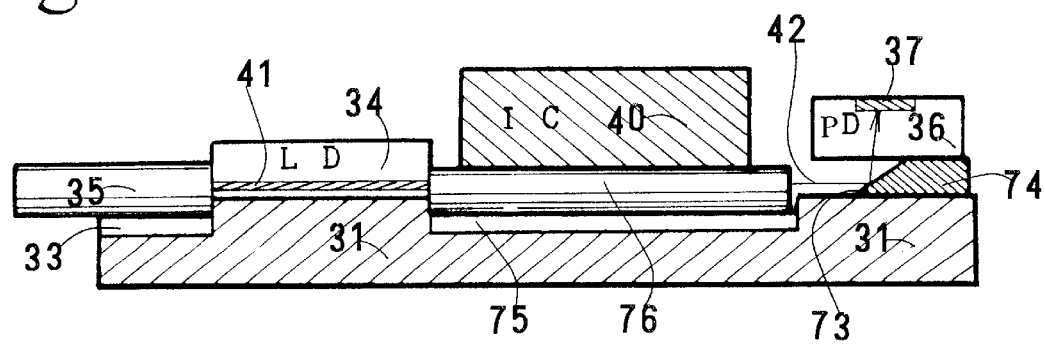
FIG. 24 is a sectional view of an LD module as Embodiment 12 including a silicon bench having a front open V-groove and an intermediate V-groove, an LD epi-down mounted upon a plateau following the front V-groove, a fiber inserted in the intermediate V-groove, an LD driving IC bonded on the substrate over the fiber-containing V-groove, a submount with a front slanting bank mounted on the end of the substrate and a bottom incidence type monitoring PD being mounted on the submount for receiving rear LD light passing through the fiber and turning upward at the bank of the submount.
Figure 25:
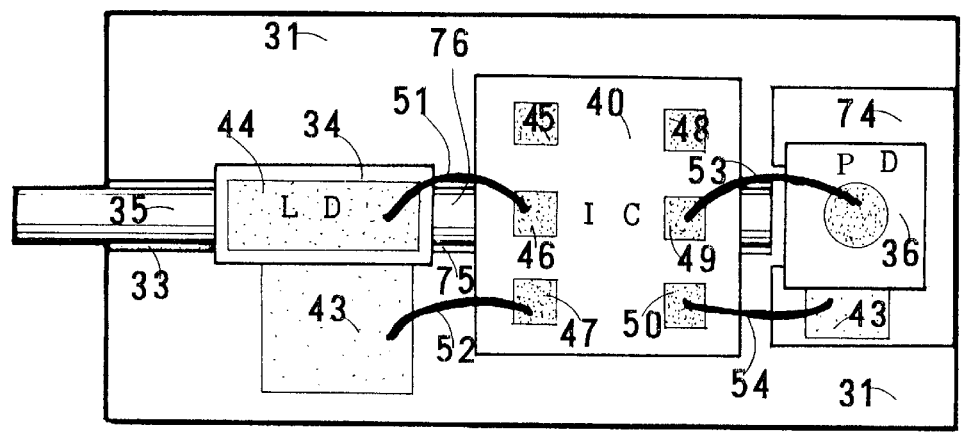
FIG. 25 is a plan view of an LD module as Embodiment 12 including a silicon bench having a front open V-groove and an intermediate V-groove, an LD epi-down mounted upon a plateau following the front V-groove, a fiber inserted in the intermediate V-groove, an LD driving IC bonded on the substrate over the fiber-containing V-groove, a submount with a front slanting bank mounted on the end of the substrate and a bottom incidence type monitoring PD being mounted on the submount.

Embodiment 12
(Bottom Incidence Type PD; Optical Fiber; FIGS. 24, 25)

Embodiment 12 employs an optical fiber as a detour and a bottom incidence type PD as a monitoring PD. FIG. 24 and FIG. 25 show a silicon substrate 31 having a front open V-groove 33 and an intermediate closed V-groove 75. A fiber 35 is fixed in the front V-groove 33. An LD 34 is epi-down fitted on the substrate 31 following the fiber 35. A detouring fiber 76 is inserted into the intermediate V-groove 75. An LD driving IC 40 is mounted upon the substrate 31 above the detouring fiber 76. A submount 74 having a slanting mirror plane 73 is glued on the silicon bench 31 at the back of the fiber 76. A bottom incidence PD 36 is epi-up bonded on the skewing submount 74. The LD 34, the fiber 76, the V-groove 75, the skewing submount 74 and the PD 36 are covered with a transparent resin. The detouring fiber 76 guides the LD rear beams 42 beneath the IC 40 to the slanting mirror plane 73 of the submount 74. The mirror plane 73 reflects the LD rear beams up toward the bottom of the PD 36. Entering the PD, the LD rear beams produce photocurrent for monitoring the power of the LD 34.

Figure 28:
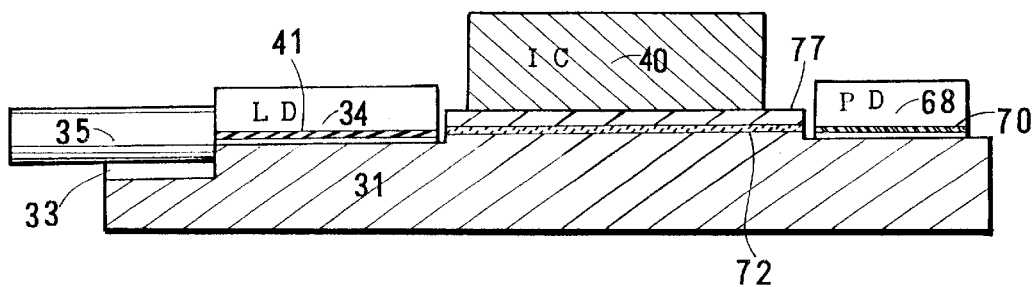
FIG. 28 is a sectional view of an LD module as Embodiment 13 including a silicon bench having a front open V-groove and a rear terrace with a waveguide, an LD epi-down mounted upon a plateau following the front V-groove, an LD driving IC bonded upon the rear terrace of the substrate following the LD and a front end incidence type monitoring PD following the IC for receiving rear LD light passing through the rear terrace of the substrate.

Embodiment 13
(Front End Incidence Type PD; Waveguide-Substrate; FIG. 28)

FIG. 28 shows Embodiment 13. The cavity-carrying submount of Embodiment 7 can be replaced by a rear terrace of a silicon bench 77 having a waveguide 72. An LD driving IC 40 is mounted upon the terrace of the bench. A front end incidence type PD 68 is epi-down fitted on a rear end of the silicon bench 31. An LD 34, the IC 40 and the PD 68 are aligned along an extension of a core of a fiber 35. Instead of the cavity of the submount, the waveguide 72 produced on the terrace of the substrate 31 allows the LD rear beams to pass and arrive at a sensing layer 70 of the PD 68. The use of the waveguide having a converging function enhances the monitoring current of the PD 68.

Furthermore, the waveguide-substrate is not restricted to the front end incidence PD but can be also applied to a bottom incidence type PD. The LD and the ID are aligned along an extension of the core of the fiber. The LD driving IC is mounted upon the terrace waveguide-substrate. A third skewing submount with a skewing mirror surface is glued at the backmost of the substrate. The bottom incidence PD is epi-up bonded upon the submount. The LD, The terrace waveguide-substrate, the skewing submount and the PD are covered with a transparent resin.

The submount allows the LD rear beams to pass beneath the IC. The rear beams which are reflected by the skewing mirror go into the PD and arrive at the sensing layar.

Figure 29:
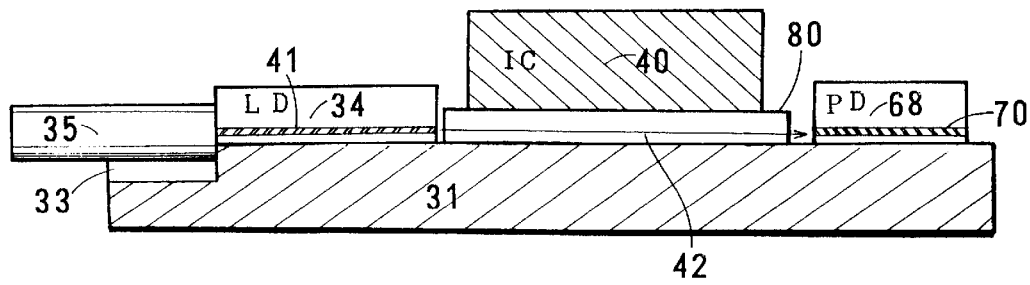
FIG. 29 is a sectional view of an LD module as Embodiment 14 including a silicon bench having a front open V-groove, an LD epi-down mounted upon a plateau following the front V-groove, a transparent submount being mounted on the substrate following the LD, an LD driving IC bonded upon the transparent submount and a front end incidence type monitoring PD following the IC and being mounted on the substrate for receiving rear LD light passing through the submount below the IC.

Embodiment 14
(Front End Incidence Type PD; Transparent Submount; FIG. 29)

Embodiment 14 is shown by FIG. 29. The silicon substrate 31 has only a front open V-groove 33. The front end incidence requires no lightguiding groove. A fiber 35 is fitted in the front V-groove 33. An LD 34 is upside down (epi-down) mounted on a plateau following the V-groove 33. A transparent submount 80 is fitted upon the substrate 31 following the LD 34. An LD driving IC 40 is bonded upon the transparent submount 80. The transparent submount is made from silica grass, transparent ceramic or transparent plastics (e.g., PMMA) The transparent submount enables an extra part of the LD rear beams 42 to pass below the IC and to raise the monitoring current. A front end incidence type monitoring PD 68 is epi-down (upside down) bonded on the backmost end of the substrate 31.

Instead of the front end incidence type PD, the transparent submount can be applied to a bottom incidence PD. The LD and the IC are aligned along an extension of a core of the fiber. The LD driving IC is mounted upon the transparent submount. A second skewing submount with a skewing mirror surface is glued at the backmost of the substrate. The bottom incidence PD is epi-up bonded upon the skewing submount. The LD, the transparent submount, the skewing submount and the PD are covered with a transparent resin.

The submount allows the LD rear beams to pass beneath the IC. The rear beams which are reflected by the skewing mirror go into the PD and arrive at the sensing layar.

We claim:
1. An LD (laser diode) module comprising:
an LD with a front end and a rear end for emitting forward signal light from the front end and rear signal light from the rear end;
an outputting medium for sending the forward signal light from the LD;
an LD driving IC (integrated circuit) supplying driving signal current to the LD;
a monitoring PD (photodiode) for monitoring power of the rear signal light;
a substrate supporting the outputting medium, the LD, the LD driving IC and the monitoring PD in series;
wires and patterns made on the substrate for leading the driving current from the IC to the LD; and
a light guiding device provided below the IC for guiding the signal rear light to the monitoring PD by detouring the rear signal light beneath the LD driving IC.

2. The LD module according to claim 1, wherein the light guiding device is formed on the substrate in the vicinity of the LD driving IC for detouring the rear signal light beneath the IC to the PD.

3. The LD module according to claim 2, wherein the light guiding device is a lightguiding groove perforated on the substrate beneath the IC from the rear end of the LD to the monitoring PD and the monitoring PD is a bottom incidence PD.

4. The LD module according to claim 3, wherein the substrate is made from single crystal silicon and the lightguiding groove is perforated by anisotropic etching.

5. The LD module according to claim 2, wherein the light guiding device is a lightguiding groove perforated on the substrate beneath the IC from the rear end of the LD to the monitoring PD, a submount having a flat top and a tunneled bottom with a longitudinal cavity is interposed between the lightguiding groove and the IC and the monitoring PD is a bottom incidence PD.

6. The LD module according to claim 2, wherein the light guiding device is a lightguiding groove perforated on the substrate beneath the IC from the rear end of the LD to the monitoring PD, a submount having a flat top, a tunneled bottom with a longitudinal cavity and a hole for passing the rear signal light into the bottom of the PD is interposed between the lightguiding groove and the IC and the monitoring PD is a bottom incidence PD.

7. The LD module according to claim 2, wherein the light guiding device is a lightguiding groove perforated on the substrate beneath the IC from the rear end of the LD to the monitoring PD, a longitudinal cavity is formed on the bottom of the IC and the PD is a bottom incidence PD.

8. The LD module according to claim 2, wherein the light guiding device is a lightguiding groove perforated on the substrate beneath the IC from the rear end of the LD to the monitoring PD, a transparent submount is interposed between the lightguiding groove and the IC and the monitoring PD is a bottom incidence PD.

9. The LD module according to claim 2, wherein the light guiding device is a waveguide produced on the substrate beneath the LD driving IC from the rear end of the LD to the monitoring PD and the monitoring PD is a front end incidence PD.

10. The LD module according to claim 2, wherein the light guiding device is a waveguide produced on the substrate beneath the LD driving IC from the rear end of the LD to the monitoring PD, a skewing submount is fitted on the substrate following the IC and the monitoring PD is a bottom incidence PD fitted on the skewing submount.

11. The LD module according to claim 1, wherein the substrate is made from one of ceramics.

12. The LD module according to claim 1, wherein the light guiding device is a submount having a flat top and a tunneled bottom with a longitudinal cavity, the submount with the tunnel cavity is interposed between the substrate and the LD driving IC and the monitoring PD is a front end incidence PD.

13. The LD module according to claim 1, wherein the light guiding device is a submount having a flat top and a tunneled bottom with a longitudinal cavity, the submount with the tunnel cavity is interposed between the substrate and the LD driving IC, a skewing submount is fitted on the substrate following the IC and the monitoring PD is a bottom incidence PD fitted on the skewing submount.

14. The LD module according to claim 1, wherein the light guiding device is a longitudinal cavity formed on the bottom of the LD driving IC and the monitoring PD is a front end incidence PD.

15. The LD module according to claim 1, wherein the light guiding device is a longitudinal cavity formed on the bottom of the LD driving IC, a skewing submount is fitted on the substrate following the IC and the monitoring PD is a bottom incidence PD fitted on the skewing submount.

16. The LD module according to claim 1, wherein the light guiding device is a submount with a waveguide interposed between the substrate and the LD driving IC and the monitoring PD is a front end incidence PD.

17. The LD module according to claim 1, wherein the light guiding device is a submount with a waveguide interposed between the substrate and the LD driving IC, a skewing submount is fitted on the substrate following the IC and the monitoring PD is a bottom incidence PD fitted on the skewing submount.

18. The LD module according to claim 1, wherein the light guiding device is an optical fiber fitted in an intermediate closed V-groove below the LD driving IC and the monitoring PD is a front end incidence PD.

19. The LD module according to claim 1, wherein the light guiding device is an optical fiber fitted in an intermediate closed V-groove below the LD driving IC, a skewing submount is fitted on the substrate following the IC and the monitoring PD is a bottom incidence PD fitted on the skewing submount.

20. The LD module according to claim 1, wherein the light guiding device is a transparent submount interposed between the substrate and the LD driving IC and the monitoring PD is a front end incidence PD.

21. The LD module according to claim 1, wherein the light guiding device is a transparent submount interposed between the substrate and the LD driving IC, a skewing submount is fitted on the substrate following the IC and the monitoring PD is a bottom incidence PD fitted on the skewing submount.

22. The LD module according to claim 1, wherein the LD, the light guiding device and the monitoring PD are covered with a transparent resin.

23. The LD module according to claim 1, wherein either or both of the LD and the PD is skewing to a beam line of the rear LD light.

24. The LD module according to claim 1, wherein the LD is a GaAs type laser diode made from GaAs and mixtures including GaAs.

25. The LD module according to claim 1, wherein the LD is an InP type laser diode made from InP and mixtures including InP.

26. The LD module according to claim 1, wherein the PD is an InP type photodiode made from InP and mixtures including InP.

27. The LD module according to claim 1, wherein the PD is a Ge type photodiode made from Ge.

28. The LD module according to claim 1, wherein the PD is a GaAs type photodiode made from GaAs and mixtures including GaAs.

29. The LD module according to claim 1, wherein the PD is a Si type photodiode made from Si.

30. The LD module according to claim 1, wherein the LD driving IC is an InP type IC made from InP.

31. The LD module according to claim 1, wherein the LD driving IC is a GaAs type IC made from GaAs.

32. The LD module according to claim 1, wherein the LD driving IC is a Si type IC made from Si.

* * * * *